United States Patent
Nakamori

(10) Patent No.: US 12,132,392 B2
(45) Date of Patent: Oct. 29, 2024

(54) POWER CONVERSION DEVICE HAVING SEMICONDUCTOR SWITCHING ELEMENT

(71) Applicant: FUJI ELECTRIC CO., LTD., Kawasaki (JP)

(72) Inventor: Akira Nakamori, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 288 days.

(21) Appl. No.: 17/332,218

(22) Filed: May 27, 2021

(65) Prior Publication Data

US 2021/0288571 A1    Sep. 16, 2021

Related U.S. Application Data

(63) Continuation of application No. PCT/JP2020/020635, filed on May 25, 2020.

(30) Foreign Application Priority Data

Jun. 19, 2019   (JP) .................................. 2019-113363

(51) Int. Cl.
*H02M 1/088* (2006.01)
*H03K 17/16* (2006.01)

(52) U.S. Cl.
CPC .......... *H02M 1/088* (2013.01); *H03K 17/165* (2013.01); *H03K 2217/0027* (2013.01)

(58) Field of Classification Search
CPC ...... H02M 1/08; H02M 1/088; H02M 1/0048; H02M 1/0051; H02M 1/0054
See application file for complete search history.

(56) References Cited

U.S. PATENT DOCUMENTS

| | | |
|---|---|---|
| 6,351,107 B1 | 2/2002 | Okita |
| 2004/0196678 A1 | 10/2004 | Yoshimura et al. |
| 2005/0017788 A1* | 1/2005 | Inoue .................. H03K 17/0406 327/432 |

(Continued)

FOREIGN PATENT DOCUMENTS

| | | |
|---|---|---|
| DE | 10356468 A1 | 10/2004 |
| DE | 112013005247 T5 | 10/2015 |

(Continued)

OTHER PUBLICATIONS

German Office Action dated Jul. 22, 2022 for German Application No. 10 2020 000 135.0.

(Continued)

*Primary Examiner* — Gustavo A Rosario-Benitez

(57) ABSTRACT

A power conversion device including a semiconductor switching element having a control electrode terminal and two main electrode terminals and configured to control a current flowing between the two main electrodes by a drive signal applied to the control electrode terminal; and a drive circuit configured to generate the drive signal in synchronization with an input signal and to turn on/off the semiconductor switching element by the drive signal. The drive circuit is configured to detect the current flowing between the two main electrode terminals of the semiconductor switching element at a timing at which the semiconductor switching element is turned off, and to adjust a drive capacity.

9 Claims, 9 Drawing Sheets

(56) References Cited

U.S. PATENT DOCUMENTS

| | | | | |
|---|---|---|---|---|
| 2011/0222326 | A1* | 9/2011 | Gray | H02M 3/33507 |
| | | | | 363/132 |
| 2011/0309815 | A1* | 12/2011 | Yu | H02M 3/156 |
| | | | | 323/311 |
| 2013/0285732 | A1* | 10/2013 | Mori | H03K 17/145 |
| | | | | 327/378 |
| 2014/0062361 | A1 | 3/2014 | Suzuki et al. | |
| 2015/0180453 | A1 | 6/2015 | Mori | |
| 2016/0248243 | A1* | 8/2016 | Yanagishima | H02H 3/087 |
| 2017/0338737 | A1* | 11/2017 | Kohama | H02M 3/156 |
| 2018/0205372 | A1 | 7/2018 | Sasaki | |
| 2018/0294709 | A1 | 10/2018 | Araki | |
| 2018/0309433 | A1* | 10/2018 | Volke | H03K 17/166 |
| 2019/0260290 | A1* | 8/2019 | Maejima | G01R 31/52 |
| 2020/0395838 | A1* | 12/2020 | Shimomura | H03K 17/166 |
| 2022/0038093 | A1* | 2/2022 | Hart | H03K 17/168 |

FOREIGN PATENT DOCUMENTS

| | | | | | |
|---|---|---|---|---|---|
| JP | 200178435 | A | 3/2001 | | |
| JP | 201445598 | A | 3/2014 | | |
| JP | 2014128053 | A | 7/2014 | | |
| JP | 2015202034 | A | 11/2015 | | |
| JP | 2016134882 | A | * | 7/2016 | H03K 17/16 |
| JP | 2016158361 | A | 9/2016 | | |
| JP | 2018182818 | A | 11/2018 | | |

OTHER PUBLICATIONS

International Search Report dated Aug. 11, 2020 from International Application No. PCT/JP2020/020635.
Written Opinion of the International Searching Authority dated Aug. 11, 2020 from International Application No. PCT/JP2020/020635.

* cited by examiner

Related Art

Related Art

POWER CONVERSION DEVICE HAVING SEMICONDUCTOR SWITCHING ELEMENT

CROSS REFERENCE TO RELATED APPLICATION(S)

This application is a Continuation of PCT Application No. PCT/JP2020/020635 filed May 25, 2020, which claims the benefit of Japanese Patent Application No. 2019-113363 filed Jun. 19, 2019. The contents of which are incorporated herein by reference.

TECHNICAL FIELD

The present invention relates to a power conversion device having a semiconductor switching element, and particularly, to a power conversion device configured to adjust a drive capacity of the semiconductor switching element according to an output current of the power conversion device.

BACKGROUND ART

In the related art, suggested is a technology of reducing noises that are generated according to a switching operation of a semiconductor switching element such as an IGBT constituting a power conversion device.

For example, PTL 1 discloses a switching element drive device that, when an output current of a MOS transistor of an upper-side arm reaches an output current upon previous switching after the MOS transistor is turned on with a high drive capacity, reduces the drive capacity of the MOS transistor to relax a rate of change of a reverse recovery current of a freewheeling diode of a lower-side arm, thereby reducing noises upon switching.

In the meantime, there is a problem of how to reduce dv/dt noise of a power conversion device configured to operate in a relatively small output current region. In the below; the problem is described in more detail with reference to the drawings.

For example, in a power conversion device (FIG. 9) configured to supply power to a load having an inductance L, dv/dt is considered at the time when an IGBT 81a of an upper-side arm constituting a half bridge circuit is switched from an on-state to an off-state, both IGBTs of the upper-side and lower-side arms are thus turned off, and the IGBT 82a of the lower-side arm is then changed from the off-state to the on-state. In this case, waveforms of a voltage (VCE) between a collector and an emitter of the IGBT 82a of the lower-side arm turned on and a current (I) flowing in a forward direction of a freewheeling diode 81b of the upper-side arm are as shown in FIG. 10. FIG. 10 depicts operations from an initial state where both IGBTs of the upper-side and lower-side arms are turned off, where the solid line a indicates a waveform when the power conversion device is operating in a relatively large output current region (large current region) and the dotted line b indicates a waveform when the power conversion device is operating in a relatively small output current region (small current region).

As shown, in the solid line a, since a reverse recovery current flowing through the freewheeling diode 81b of the upper-side arm gently returns, dv/dt of the voltage (VCE) between the collector and the emitter of the IGBT 82a of the lower-side arm is relatively small. In contrast, in the dotted line b, since the reverse recovery current flowing through the freewheeling diode 81b of the upper-side arm sharply returns, dv/dt of the voltage (VCE) between the collector and the emitter of the IGBT 82a of the lower-side arm is relatively large. That is, as the current of the power conversion device becomes smaller, the dv/dt noise tends to increase due to a reverse direction return characteristic of the freewheeling diode.

Therefore, it is preferable to take measures to relax dv/dt when the power conversion device operates in the small current region while monitoring the current of the power conversion device. However, PTL 1 does not reduce the dv/dt noise at the time when the power conversion device operates in the small current region.

CITATION LIST

Patent Literature

[PTL 1] JP2018-182818A

SUMMARY

The present invention has been made in view of the above situations, and an object thereof is to provide a power conversion device having a semiconductor switching element and capable of detecting that the power conversion device is operating in a small current region, and reducing dv/dt noise upon switching of the semiconductor switching element when the power conversion device is operating in the small current region.

In order to achieve the above object, a power conversion device of the present invention includes a semiconductor switching element having a control electrode terminal and two main electrode terminals and configured to control a current flowing between the two main electrode terminals by a drive signal applied to the control electrode terminal; and a drive circuit configured to generate the drive signal in synchronization with an input signal and to turn on/off the semiconductor switching element by the drive signal, wherein the drive circuit is configured to detect the current flowing between the two main electrode terminals of the semiconductor switching element at a timing at which the semiconductor switching element is turned off, and to adjust a drive capacity.

In the power conversion device, a current region (a large current region or a small current region, for example) in which the power conversion device operates is determined by detecting the current (main current) flowing between the main electrode terminals at the timing at which the semiconductor switching element is turned off.

The drive capacity for turning on/off the semiconductor switching element, i.e., a magnitude of a current that can be supplied to the control electrode terminal is adjusted based on a magnitude of the main current detected at the timing at which the semiconductor switching element is turned off. Thereby, it is possible to effectively reduce the dv/dt noise that varies depending on the magnitude of the main current.

In particular, when the main current becomes equal to or smaller than a predetermined value, the drive capacity is preferably reduced. Thereby, when turning on the semiconductor switching element in a next cycle, it is possible to effectively reduce the dv/dt noise by reducing a rate of change in voltage between the main electrode terminals.

Note that, when a semiconductor switching element having a sense terminal configured to output a sense current corresponding to the main current is used, it is possible to simply detect the main current by the sense current.

Specifically, the drive circuit may be constituted by a current detection unit configured to output a selection signal based on a magnitude of the sense current, a switch unit configured to output a voltage signal for determining the drive capacity based on the selection signal, and a drive unit configured to generate the drive signal by using the voltage signal and the input signal.

The current detection unit includes a sense voltage generation circuit configured to convert the sense current output from the sense terminal into a voltage and to output the voltage as a sense voltage, a comparator configured to compare the sense voltage and a reference voltage and to output a result of the comparison, a latch circuit configured to hold a signal indicative of the result of the comparison in synchronization with the input signal, and a selection circuit configured to output the selection signal based on an output of the latch circuit.

The switch unit includes a plurality of voltage dividing resistor elements inserted in series between a voltage source and a reference potential, and a switch element configured to select any one of at least two different voltages generated in the plurality of voltage dividing resistor elements by the selection signal and to output the selected voltage as the voltage signal.

The drive unit is configured to turn on the semiconductor switching element by outputting a drive signal of a current corresponding to the voltage signal in synchronization with the input signal, and to extract charges accumulated in the control electrode of the semiconductor switching element when turning off the semiconductor switching element.

Note that, when turning off the semiconductor switching element, it is determined whether the sense voltage is equal to or higher than a reference voltage by the comparator of the current detection unit, and a result of the determination is kept by the latch circuit until the semiconductor switching element is turned off in a next cycle.

The sense voltage generation circuit of the current detection unit may be constituted by inserting a resistor element between the sense terminal and the reference potential.

In the configuration of the current detection unit, preferably, a constant current source is further provided, and a current output from the constant current source is caused to flow through the resistor element to increase the sense voltage by a predetermined voltage. The main current at which the dv/dt noise is problematic becomes a relatively small current region, and when trying to detect this region by converting a sense current into a sense voltage by a configuration using a general resistor element, the sense voltage corresponding to this region is extremely small such as 0.1V, for example. For this reason, when the resistor element configured to generate the sense voltage is overlapped with a constant current output from the constant current source, the sense voltage can be conveniently increased to an operation guarantee range of the comparator. At this time, the reference voltage that is input to the comparator is also set higher by an amount of increase.

Note that, a value of the constant current and a resistance value of the resistor element are determined by a value of the sense current becoming a threshold value or the operation guarantee range of the comparator.

According to the present invention, since the operation in the small current region is detected to suppress the drive current of the semiconductor switching element, it is possible to effectively reduce the dv/dt noise. By suppressing the drive current according to the current region, it is possible to optimize the power loss and noise of the semiconductor switching element, as compared to the related art.

DESCRIPTION OF EMBODIMENTS

Hereinbelow, a power conversion device of each embodiment of the present invention will be described in detail with reference to the drawings. A feature of the power conversion device of the present invention is a circuit configuration configured to adjust a drive capacity (a capacity to supply a current for charging a gate of a switching element) of a semiconductor switching element according to a main current of the semiconductor switching element, and to reduce a switching noise of the semiconductor switching element, specifically, an effect of dv/dt noise when the semiconductor switching element is turned on. In the below; each embodiment is described.

Figure 1:
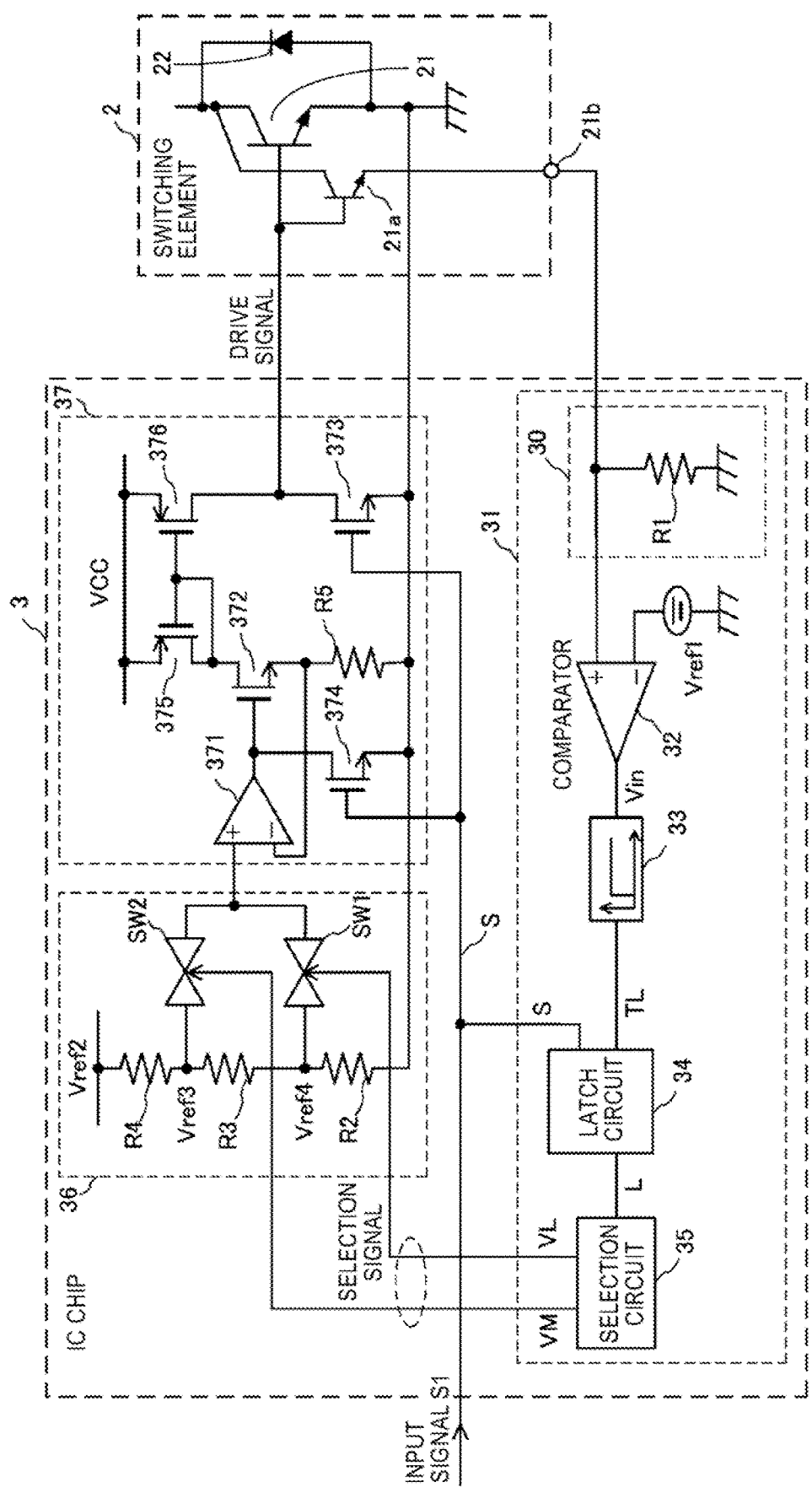
FIG. 1 is a block diagram depicting an entire configuration of a power conversion device in accordance with a first embodiment of the present invention.

First Embodiment (Configuration)
An IPM (Intelligent Power Module) 1 of the present embodiment is a power conversion device that is applied to a joint of an industrial robot, an elevator or an industrial air-conditioner, for example, and mainly includes a switching element 2 and an IC chip 3, as shown in FIG. 1.

The switching element 2 may be constituted by an IGBT 21 and a freewheeling diode 22 inverse-parallel connected to the IGBT 21, for example, or may be an RC-IGBT of one chip. The IGBT 21 is configured to turn on in response to a drive signal applied from the IC chip 3 to a gate (control electrode terminal), so that a current (main current) flows from a collector to an emitter and constant power is supplied to a load (not shown). The emitter of the IGBT 21 is connected to a reference potential of the IC chip 3, which will be described later. The IGBT 21 is also connected in parallel to an IGBT 21a for current sense, so that a sense current is output at a constant ratio according to the main current.

The IC chip 3 is a drive circuit configured to change a magnitude of a current for driving the IGBT 21, according to a magnitude of the sense current, and mainly has a current detection unit 31, a switch unit 36, and a drive unit 37. The current detection unit 31 is configured to output a selection signal to the switch unit 36, based on a magnitude of the sense current. The switch unit 36 is configured to output a reference voltage signal for determining a magnitude of the drive current of the IGBT 21, based on the selection signal. The drive unit 37 is configured to generate a drive current of a predetermined magnitude based on the reference voltage signal and to output the same to the gate of the IGBT 21.

The current detection unit 31 has a comparator 32, a filter circuit 33 connected to an output end of the comparator 32, a latch circuit 34 configured to latch an output signal of the filter circuit 33, and a selection circuit 35 configured to input thereto an output signal of the latch circuit 34 and to output a selection signal to the switch unit 36.

A non-inverting input terminal of the comparator 32 is connected to a sense terminal 21b of the IGBT 21 and is also connected to a reference potential via a resistor element R1. A sense current output from the sense terminal 21b is converted into a voltage (sense voltage) by the resistor element R1. An inverting input terminal of the comparator 32 is connected to a plus side of a reference voltage source Vref1. A minus side of the reference voltage source Vref1 is connected to the reference potential.

The comparator 32 is configured to compare a voltage between both ends of the resistor element R1 and the reference voltage Vref1, and outputs an H-level signal when the voltage between both ends of the resistor element R1 is greater and outputs an L-level signal when a voltage value of the reference voltage source Vref1 is greater.

Figure 2:
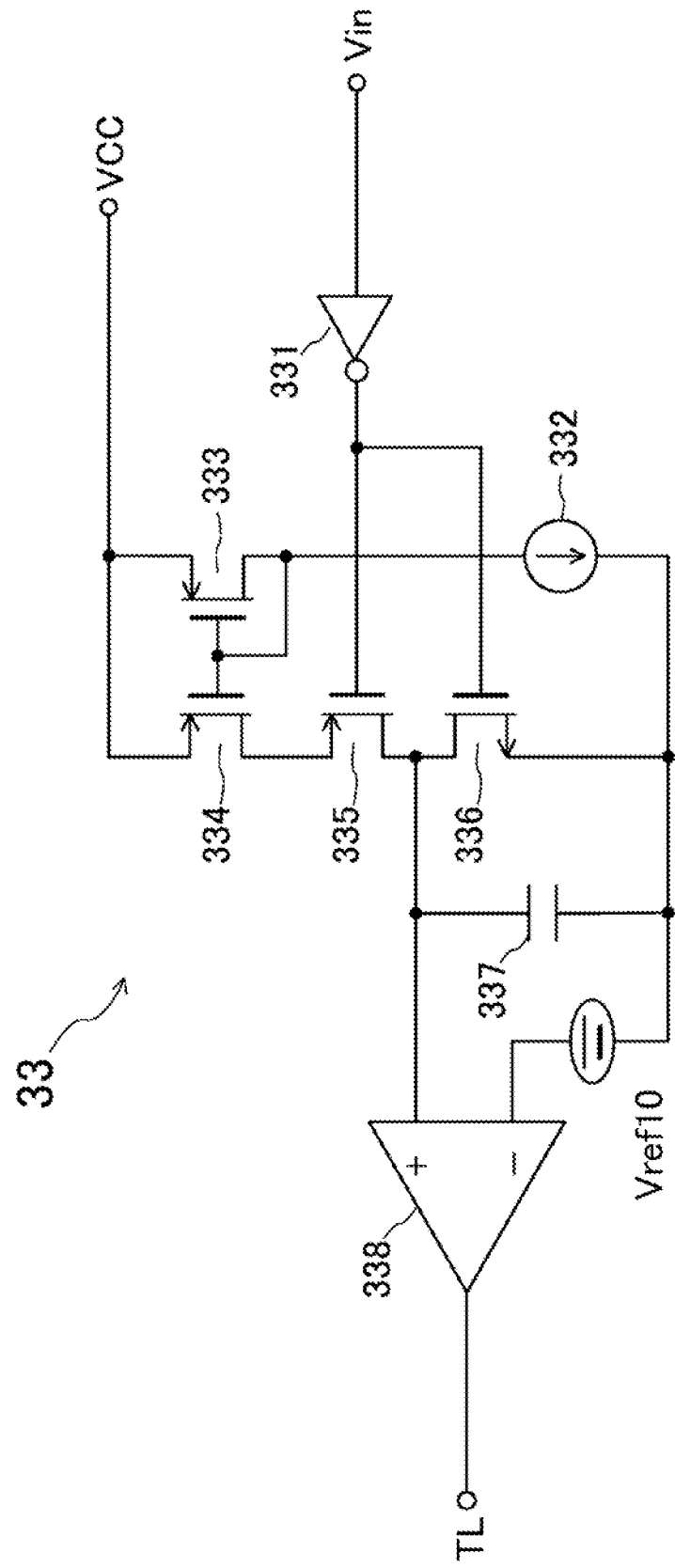
FIG. 2 is a circuit diagram depicting an example of a filter circuit of FIG. 1.

The filter circuit 33 is a circuit configured to delay only a rising of an output signal of the comparator 32 for a predetermined time, and can be implemented by a circuit configuration shown in FIG. 2.

As shown in FIG. 2, the filter circuit 33 has P-type MOSFETs 333 and 334 connected to a power supply VCC and configured to form a current mirror circuit, and a constant current source 332 inserted between a drain of the P-type MOSFET 333 and a reference potential. In addition, a P-type MOSFET 335 and an N-type MOSFET 336 are inserted in series between a drain of the P-type MOSFET 334 and the reference potential. A connection point of the P-type MOSFET 335 and the N-type MOSFET 336 is connected to a non-inverting input terminal of a comparator 338 and one end of a capacitor 337. An inverting input terminal of the comparator 338 is connected to a plus side of a reference voltage source Vref10. The other end of the capacitor 337 and the other end of the reference voltage source Vref10 are connected to the reference potential. An input end of a NOT element 331 becomes an input end of the filter circuit 33, and is connected to an output end of the comparator 32. An output end of the NOT element 331 is connected to gates of the P-type MOSFET 335 and the N-type MOSFET 336. An output end of the comparator 338 becomes an output end of the filter circuit 33, and is connected to an input end of the latch circuit 34.

In the filter circuit 33 configured as described above, when an input to the filter circuit 33 becomes an H-level from an L-level, an output of the NOT element 331 becomes an L-level. Then, the N-type MOSFET 336 is turned off and the P-type MOSFET 335 is turned on, so that the capacitor 337 is charged by a current prescribed in the constant current source 332. An output of the comparator 338 becomes an H-level when a charging voltage of the capacitor 337 exceeds the reference voltage Vref10.

Thereafter, when the input to the filter circuit 33 becomes an L-level, the output of the NOT element 331 becomes an H-level. Then, the N-type MOSFET 336 is turned on and the P-type MOSFET 335 is turned off, so that the charges charged in the capacitor 337 are rapidly discharged. As a result, a voltage of the non-inverting input terminal of the comparator 338 becomes equal to or lower than the reference voltage Vref10, and the output of the comparator 338 becomes an L-level.

Therefore, the filter circuit 33 outputs the input signal with a delay for a predetermined time only when the input signal becomes an H-level. The delay time can be adjusted by an output current value of the constant current source 332, a mirror ratio of the current mirror circuit, a charging time of the capacitor 337 determined by an electrostatic capacitance value of the capacitor 337, and the reference voltage Vref10.

Figure 3:
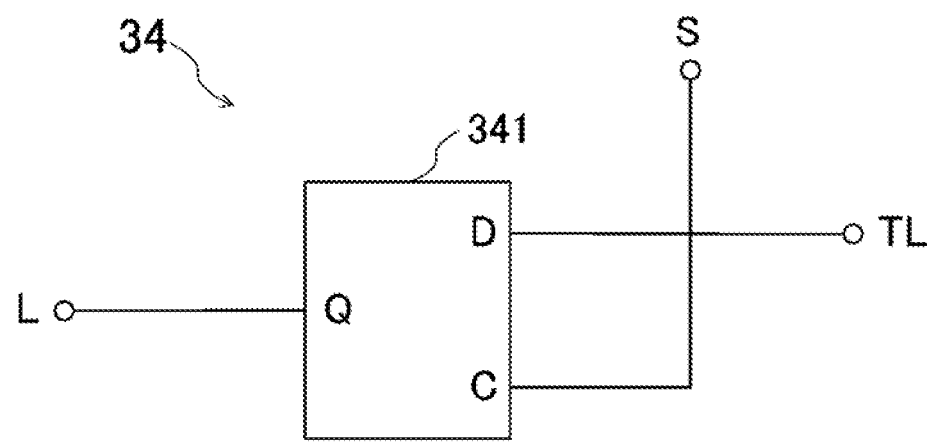
FIG. 3 is a circuit diagram depicting an example of a latch circuit of FIG. 1.

An example of the configuration of the latch circuit 34 is shown in FIG. 3. As shown in FIG. 3, the latch circuit 34 can be implemented by a D-type flipflop 341. A D terminal (data input end) of the D-type flipflop 341 is connected to the output end of the filter circuit 33, and a C terminal (clock input end) is connected to a signal line S, so that an input signal S1 is input thereto. A Q terminal (output end) of the D-type flipflop 341 is connected to an input end of the selection circuit 35.

The latch circuit 34 adopting the above configuration is configured to latch an output signal TL (L-level or H-level) of the filter circuit 33 at the rising of the input signal S1 supplied from an external control circuit (not shown) through the signal line S, and to output the corresponding state to the Q terminal. An output state of the Q terminal is kept until a next start timing of the input signal S1. Although described later, when the input signal S1 is an L-level, the IGBT is turned on, and when the input signal S1 is an H-level, the IGBT is turned off.

Figure 4:
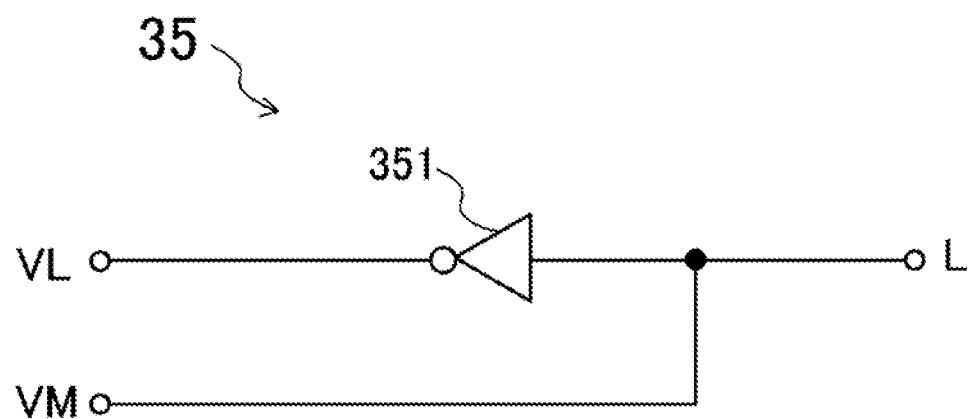
FIG. 4 is a circuit diagram depicting an example of a selection circuit of FIG. 1.

The selection circuit 35 is configured to output selection signals VL and VM generated based on the output signal from the latch circuit 34, to the switch unit 36. An example of the configuration of the selection circuit 35 is shown in FIG. 4. As shown in FIG. 4, the selection circuit 35 is configured by a NOT element 351.

An input end of the NOT element 351 is connected to an output end of the latch circuit 34. An output end of the NOT element 351 becomes an output end of the selection circuit 35, and the selection signal VL is output from the output end. The input end of the NOT element 351 also becomes another output end of the selection circuit 35, and the selection signal VM is output from the output end.

When the main current of the IGBT 21 is small, the sense voltage generated based on the sense current becomes equal to or lower than the reference voltage Vref1 and the output of the comparator 32 becomes an L-level. As a result, the output of the latch circuit 34 latched at the rising of the input signal S1 becomes an L-level. Therefore, since the input of the NOT element 351 becomes an L-level and the output becomes an H-level, the selection signal VL of the selection circuit 35 becomes an H-level and the selection signal VM becomes an L-level.

When the main current of the IGBT 21 is large, since the sense voltage becomes higher than the reference voltage Vref1, the output of the comparator 32 becomes an H-level. As a result, the output of the latch circuit 34 latched at the rising of the input signal S1 becomes an H-level. Therefore, since the input of the NOT element 351 becomes an H-level and the output becomes an L-level, the selection signal VL of the selection circuit 35 becomes an L-level and the selection signal VM becomes an H-level.

The switch unit 36 has a switch element SW1, a switch element SW2, resistor elements R2 to R4 connected in series to form a resistive voltage divider circuit, and a reference voltage Vref2. One end (resistor element R4-side) of the resistive voltage divider circuit formed by the resistor elements R2 to R4 is connected to the reference voltage Vref2, and the other end (resistor element R2-side) is connected to the reference potential.

The switch element SW1 and the switch element SW2 can be each constituted by a CMOS switch (a transfer gate) where an N-type MOSFET and a P-type MOSFET are connected in parallel, for example, and are each in a conduction state when a gate signal is an H-level. The switch element SW1 or the switch element SW2 becomes selectively conductive according to an output from the selection circuit 35. Specifically, the conduction state is made when the selection signal VL is input to the gate of the switch element SW1 and the output signal of the 30) comparator 32 is an L-level. The conduction state is made when the selection signal VH is input to the gate of the switch element SW2 and the output signal of the comparator 32 is an H-level.

An input-side of the switch element SW1 is connected to a connection point of the resistor element R2 and the resistor element R3, and an output-side is connected to a non-inverting input terminal of an operational amplifier 371, which will be described later.

An input-side of the switch element SW2 is connected to a connection point of the resistor element R3 and the resistor element R4, and an output-side is similarly connected to the non-inverting input terminal of the operational amplifier 371.

By the resistive voltage divider circuit constituted by the resistor elements R2 to R4, when the switch element SW1 become conductive, a relatively low voltage Vref4 is applied to the non-inverting input terminal of the operational amplifier 371, and when the switch element SW2 becomes conductive, a relatively high voltage Vref3 (>Vref4) is applied to the non-inverting input terminal of the operational amplifier 371. These correspond to the cases where the main current of the IGBT 21 is small and large, respectively. Note that, a resistance value of each of the resistor elements R2 to R4 is set as appropriate so that a desired resistive voltage dividing effect is obtained.

The drive unit 37 is configured to change a drive capacity of the IGBT 21 according to a magnitude of the main current of the IGBT 21. The drive unit 37 has an operational amplifier 371, an N-type MOSFET 372, MOSFETs 373 and 374 for turn-off, a power supply VCC, P-type MOSFETs 375 and 376 configured to form a current mirror circuit connected to the power supply VCC, and a resistor element R5. Although the detailed descriptions of the basic principle of the drive unit 37 are omitted here because it is described in JP2013-219633A, for example, the drive unit supplies a current, which is obtained by applying the voltage Vref3 or Vref4 to the resistor R5 by a virtual short-circuit of the operational amplifier 371, to the gate of the IGBT 21. In the below; the matters relating to the present embodiment are described.

As for the matters relating to the present embodiment, the MOSFET 373 for turn-off (switch circuit) is described. The MOSFET 373 for turn-off is, for example, constituted by an N-type MOSFET, and a drain thereof is connected to a drain of the P-type MOSFET 376 constituting the current mirror circuit, and is also connected to the gate of the IGBT 21. A source of the MOSFET 373 for turn-off is connected to the reference potential. A gate of the MOSFET 373 for turn-off is connected to the signal line S. The input signal S1 of an H-level is supplied to the gate through the signal line S, so that the MOSFET 373 for turn-off is turned on and a conduction state is made between the gate of the IGBT 21 and the reference potential. Thereby, the charges accumulated in the gate of the IGBT 21 are extracted, so that the IGBT 21 is turned off. Note that, at this time, since the MOSFET 374 for turn-off is also turned on and the N-type MOSFET 372 is thus turned off, the current output from the drain of the P-type MOSFET 376, which is an output of the current mirror circuit, becomes zero.

On the other hand, when the input signal S1 of an L-level is applied to the gate through the signal line S, the MOSFET 373 for turn-off is turned off, so that the conduction between the gate of the IGBT 21 and the reference potential is cut off. Then, a predetermined drive signal is supplied from the P-type MOSFET 376 to the gate of the IGBT 21, so that the IGBT 21 is turned on.

As described above, when the input signal S1 is an L-level, the IGBT 21 is turned on, and when the input signal S1 is an H-level, the IGBT 21 is turned off.

(Operations)

Subsequently, operations of the IPM 1 configured as described above are described.

In the current detection unit 31, the sense voltage that is proportional to a magnitude of the main current of the IGBT 21 is applied to the non-inverting input terminal of the comparator 32.

When a magnitude of the main current of the IGBT 21 is larger than a predetermined value, the sense voltage becomes higher than the reference voltage Vref1, so that the output signal of the comparator 32 becomes an H-level. Then, the output of the filter circuit 33 and the output of the latch circuit 34 latched at the rising of the input signal S1 also become H-levels. As a result, the selection signal VL output from the selection circuit 35 becomes an L-level, and the selection signal VM becomes an H-level.

By the selection signal, the switch element SW1 of the switch unit 36 is not conductive and the switch element SW2 becomes conductive, so that the reference voltage Vref3 on a higher side is output to the operational amplifier 371 of the drive unit 37.

While the input signal S1 is an H-level, the N-type MOSFET 374 is turned on and the N-type MOSFET 372 is turned off. For this reason, the current does not flow through the P-type MOSFETs 375 and 376 constituting the current mirror circuit. On the other hand, since the N-type MOSFET 373 is turned on, the gate of the IGBT 21 becomes an L-level, so that the IGBT 21 is turned off.

Then, when the input signal S1 becomes an L-level, the N-type MOSFET 374 is turned off, and the output of the operational amplifier 371 corresponds to the reference voltage Vref3. As a result, the N-type MOSFET 372 is turned on, and a voltage between both ends of the resistor element R5 becomes Vref3. When a resistance value of the resistor element R5 is denoted with r5, a current of [the voltage value Vref3/the resistance value r5] flows through the resistor element R5. Since the N-type MOSFET 373 is turned off, a current that is proportional to [the voltage value Vref3/the resistance value r5] flows from the P-type MOSFET 376 constituting the current mirror circuit to the gate of the IGBT 21, so that the IGBT 21 is turned on. Thus, in a case where the power conversion device operates in the large current region, when the input signal S1 is an H-level, the IGBT 21 is turned off, and when the input signal S1 is an L-level, the drive signal (gate charging current) that is proportional (a coefficient of proportionality is a mirror ratio of the current mirror circuit) to [the voltage value Vref3/the resistance value r5] is supplied to the gate of the IGBT 21, so that the IGBT 21 is turned on.

When a magnitude of the main current of the IGBT 21 is equal to or smaller than the predetermined value, the sense voltage becomes equal to or lower than the reference voltage Vref1, so that the output signal of the comparator 32 becomes an L-level. Then, the output of the filter circuit 33 and the output of the latch circuit 34 latched at the rising of the input signal S1 also become L-levels. As a result, the selection signal VL output from the selection circuit becomes an H-level, and the selection signal VM becomes an L-level.

By the selection signal, the switch element SW1 of the switch unit 36 becomes conductive and the switch element SW2 is not conductive, so that the reference voltage Vref4 on a lower side is output to the operational amplifier 371 of the drive unit 37.

While the input signal S1 is an H-level, the IGBT 21 is turned off, in the similar manner to the above case. Then, when the input signal S1 becomes an L-level, the N-type MOSFET 374 is turned off, and the output of the operational amplifier 371 corresponds to the reference voltage Vref4. As a result, the N-type MOSFET 372 is turned on, and the voltage between both ends of the resistor element R5 becomes Vref4. Therefore, a current of [the voltage value Vref4/the resistance value r5] flows through the resistor element R5. The N-type MOSFET 373 is turned off, a current that is proportional to [the voltage value Vref4/the resistance value r5] flows from the P-type MOSFET 376 constituting the current mirror circuit to the gate of the IGBT 21, so that the IGBT 21 is turned on. Thus, in a case where the power conversion device operates in the small current region, when the input signal S1 is an H-level, the IGBT 21 is turned off, and when the input signal S1 is an L-level, the drive signal (gate charging current) proportional to [the voltage value Vref4/the resistance value r5] is supplied to the gate of the IGBT 21, so that the IGBT is turned on.

Since [the voltage value Vref3/the resistance value r5] is larger than [the voltage value Vref4/the resistance value r5], when the power conversion device operates in the small current region, the drive capacity to the gate of the IGBT 21 is reduced, as compared to the case where the power conversion device operates in the large current region.

Operations/Effects

Figure 5:
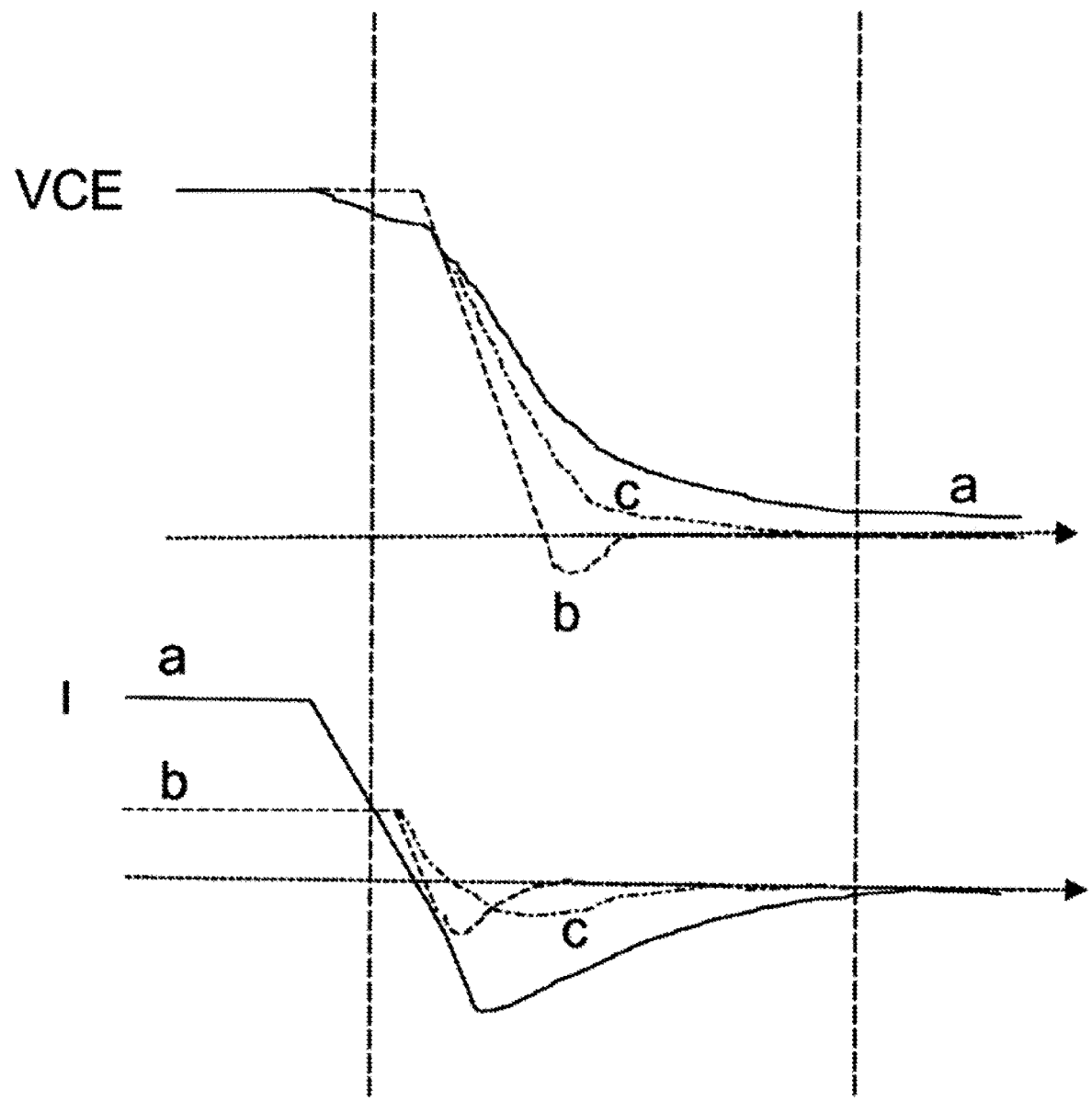
FIG. 5 is a waveform diagram showing an effect of the embodiment of the present invention.

As described above, according to the present embodiment, the drive capacity to the gate of the IGBT 21 is adjusted according to the main current of the IGBT 21 constituting the power conversion device. Specifically, when a magnitude of the main current of the IGBT is monitored by the sense current and a value thereof becomes equal to or smaller than a predetermined value, it is assumed that the power conversion device is operating in the small current region, and the drive capacity to the gate of the IGBT is reduced. As a result, as shown in FIG. 5, dv/dt is relaxed. In FIG. 5, the dashed-dotted line c indicates an operating waveform when the drive capacity is reduced in the small current region. It can be seen that the rate of change in voltage (VCE) between the collector and the emitter is gentler, as compared to a case (related art) where the drive capacity is not adjusted even in the small current region shown with the dotted line b.

In this way, in the large current region where the loss is more problematic, the drive capacity is increased since the effect of the noise is small, and in the small current region (since the current is small, the loss is relatively small) where the switching noise is problematic, the drive capacity is reduced, so that it is possible to optimize the power loss and noise of the semiconductor switching element, as compared to the related art.

Second Embodiment

Subsequently, a second embodiment is described.

Figure 6:
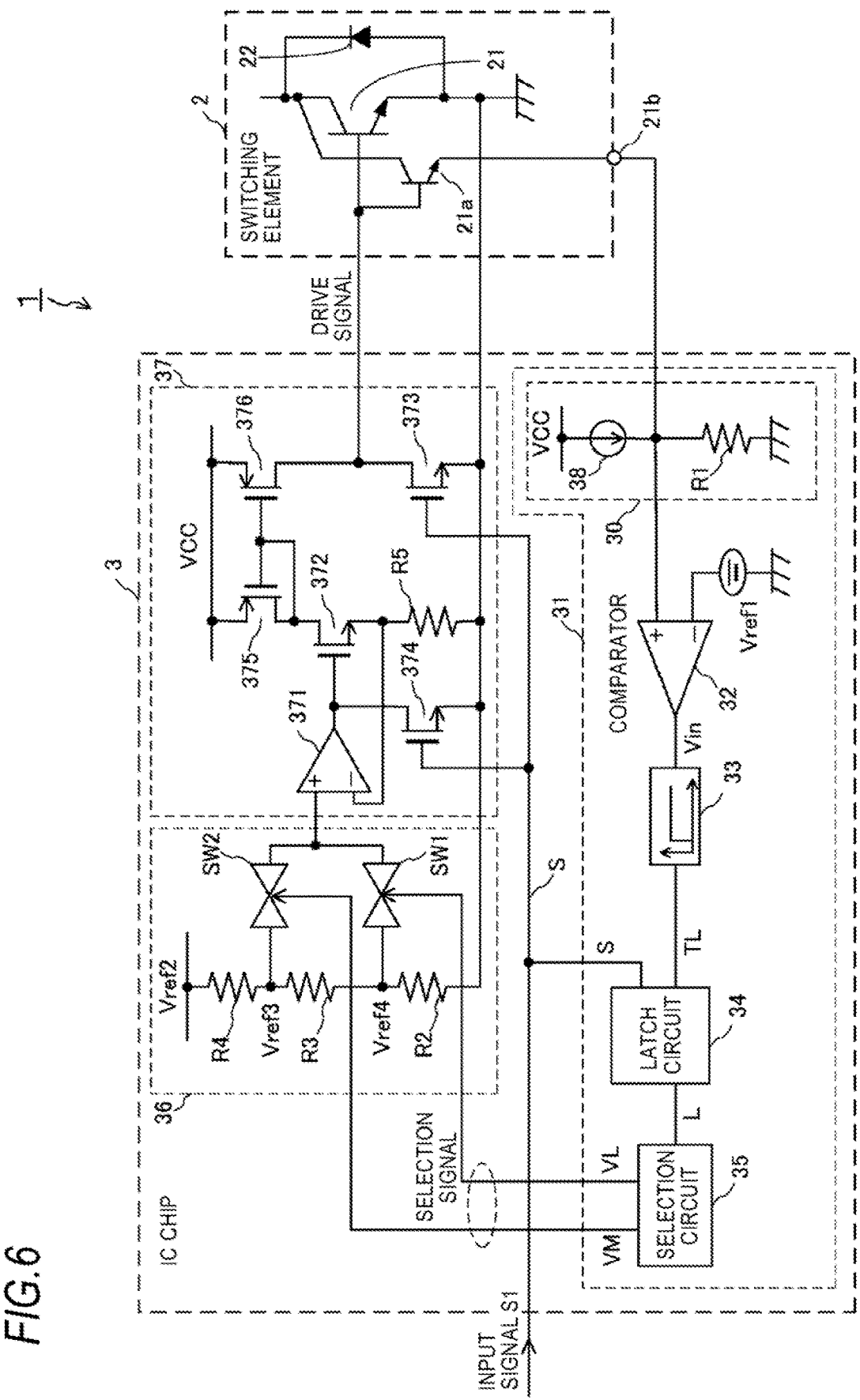
FIG. 6 is a block diagram depicting an entire configuration of a power conversion device in accordance with a second embodiment of the present invention.

FIG. 6 depicts a configuration of a power conversion device according to a second embodiment. FIG. 6 is different from FIG. 1, in that a constant current source 38 is provided on a connection point-side of the resistor element R1 for converting a sense current into a voltage to the sense terminal 21b. Since the other configurations are similar to FIG. 1, the same elements are denoted with the same reference signs and the descriptions thereof are omitted.

A constant current output from the constant current source 38 flows to the reference potential through the resistor element R1. Thereby, a sense voltage value is increased by a voltage generated by a constant current value and a resistance value of the resistor element R1.

Actually, about 10% of the rated current of the IGBT may be determined as the small current region. In this case, as shown in FIG. 1, when it is intended to determine the small current region by using the sense current, the reference voltage Vref1 of the comparator 32 becomes a small value such as about 0.1V. Such a small value may deviate from an operating range of the comparator, so that the comparator cannot accurately compare the input signal.

According to the present embodiment, since a constant voltage generated by the constant current is added to the sense voltage that is generated by causing the sense current of the IGBT 21 to flow through the resistor element R1, and the added voltage is compared to the reference voltage Vref1, the reference voltage Vref1 can be set within the operating range of the comparator. In this way, it is possible to accurately detect whether the power conversion device is operating in the small current region.

Another Embodiment

Figure 7:
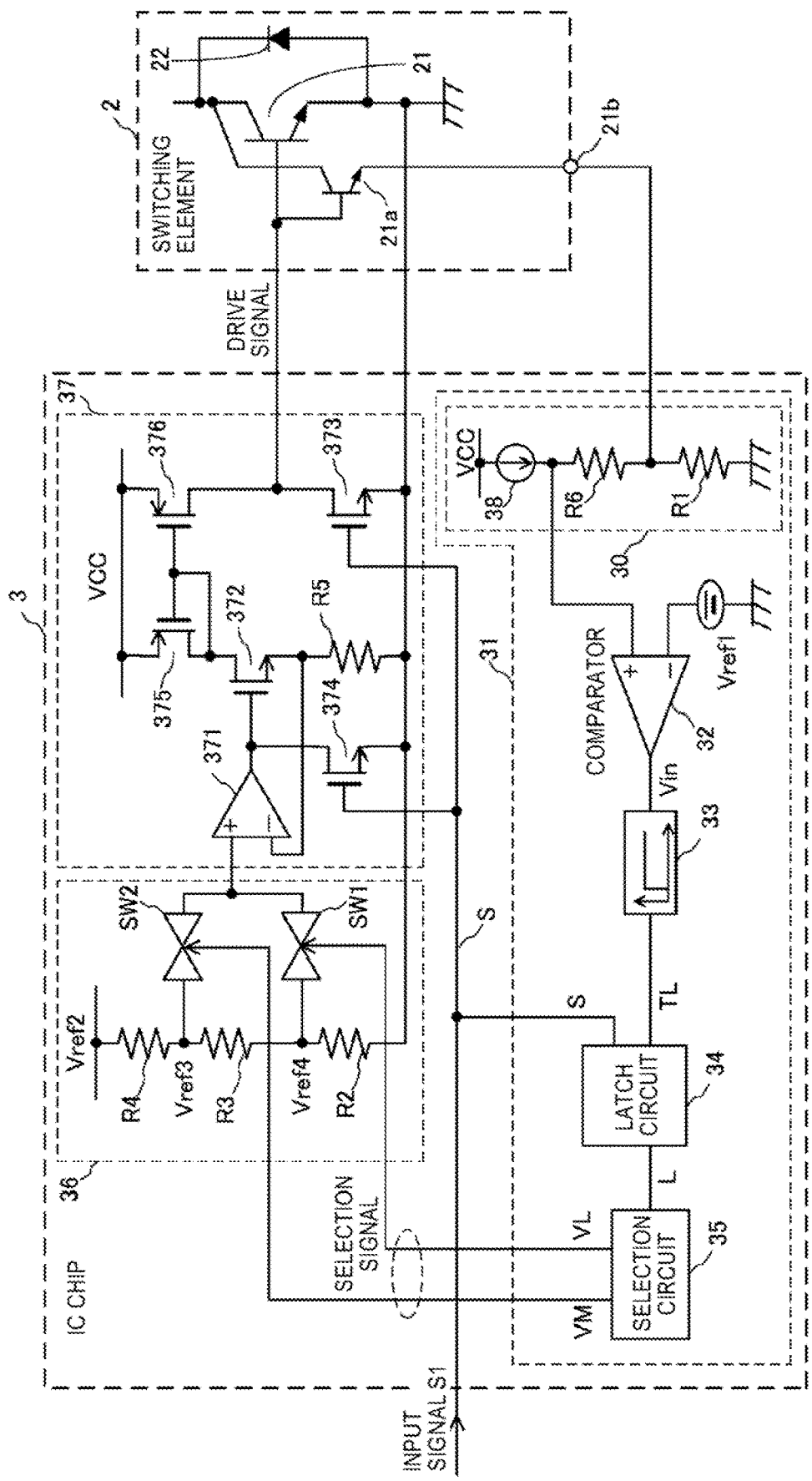
FIG. 7 depicts another embodiment of FIG. 6.

FIG. 7 depicts another embodiment for accurately detecting the small current region. FIG. 7 is different from FIG. 6, in that a resistor element R6 is inserted between the constant current source and the resistor element R1. A connection point of the resistor element R1 and the resistor element R6 is connected to the sense terminal 21b, and a connection point of the resistor element R6 and the constant current source 38 is connected to the non-inverting input terminal of the comparator 32.

In the present embodiment, a constant voltage that is generated as the constant current flows through the resistor elements R1 and R6 is added to the sense voltage that is generated at both ends of the resistor element R1 by the sense current. Thereby, it is possible to detect that the IGBT is in the small current region within the operation guarantee range of the comparator.

Third Embodiment

Subsequently, a third embodiment is described.

Figure 8:
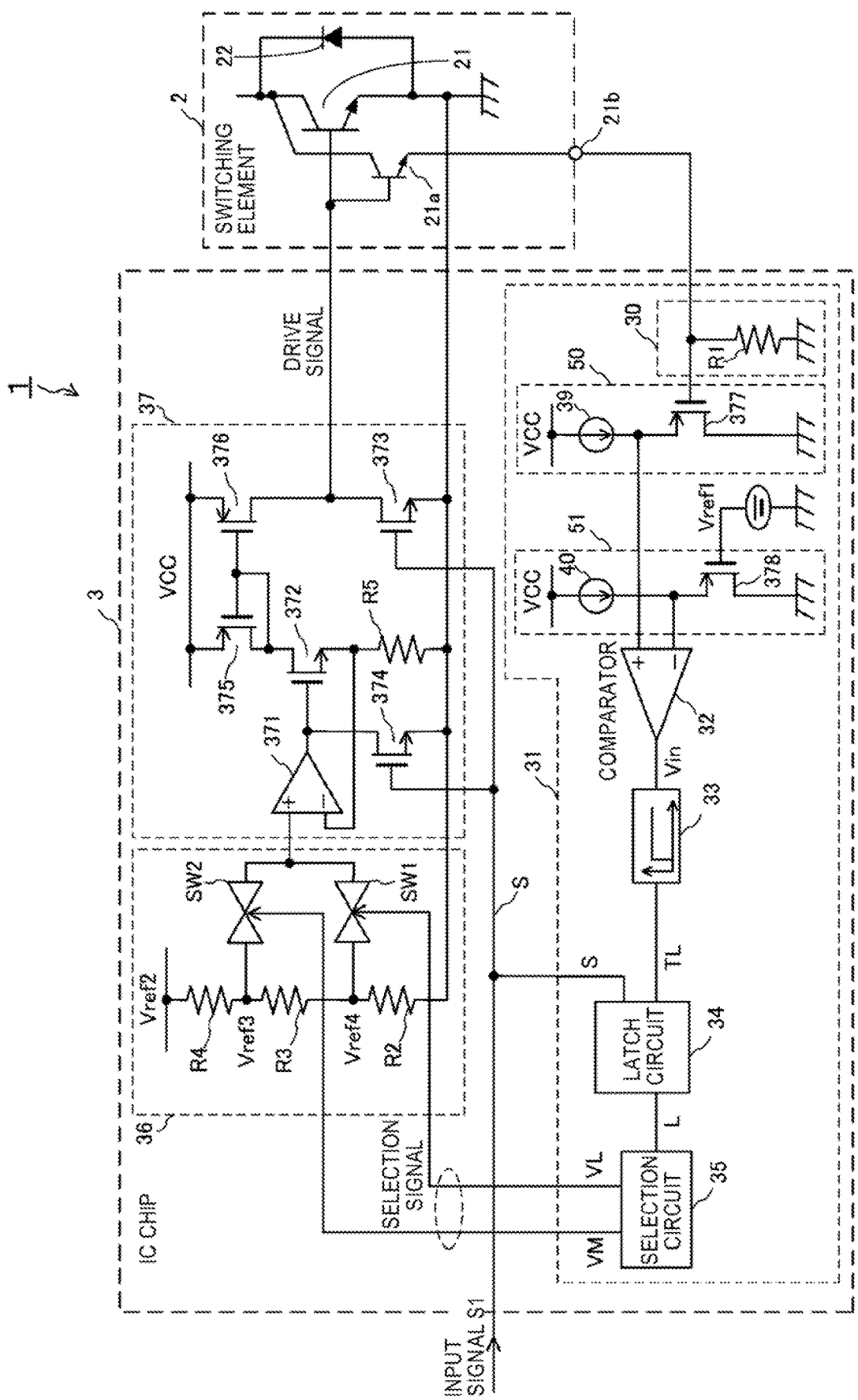
FIG. 8 is a block diagram depicting an entire configuration of a power conversion device in accordance with a third embodiment of the present invention.
Figure 9:
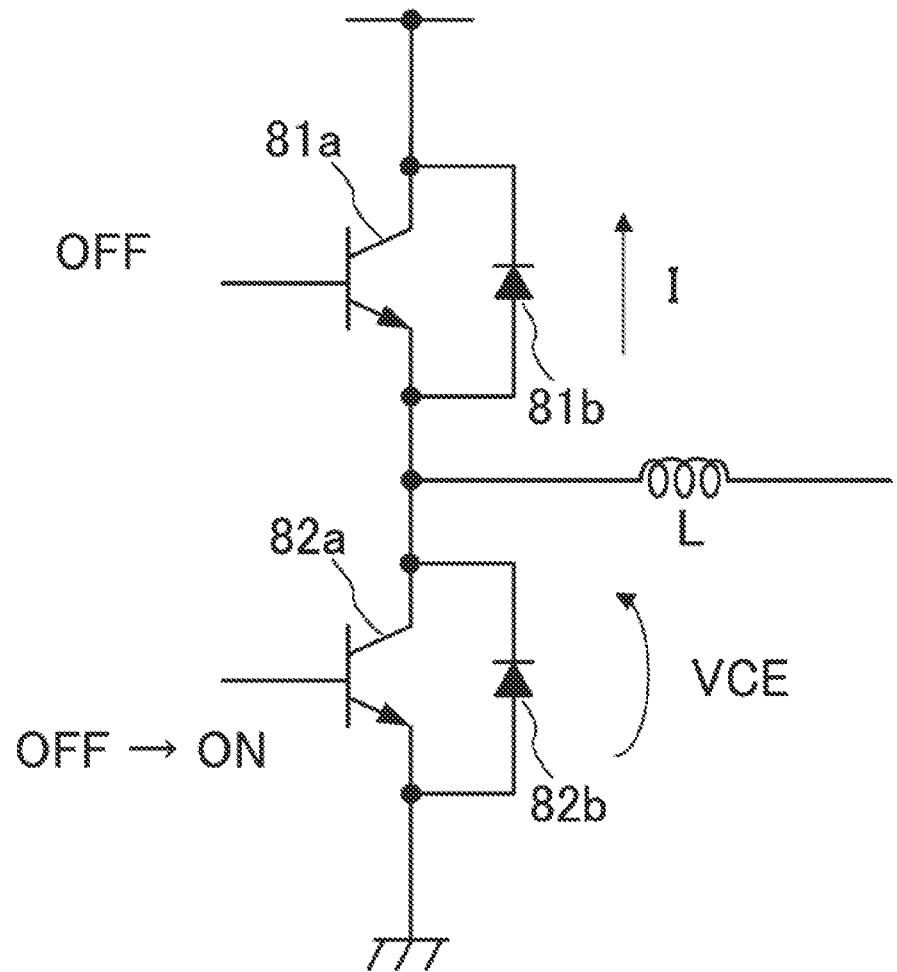
FIG. 9 depicts a problem of a power conversion device of the related art.
Figure 10:
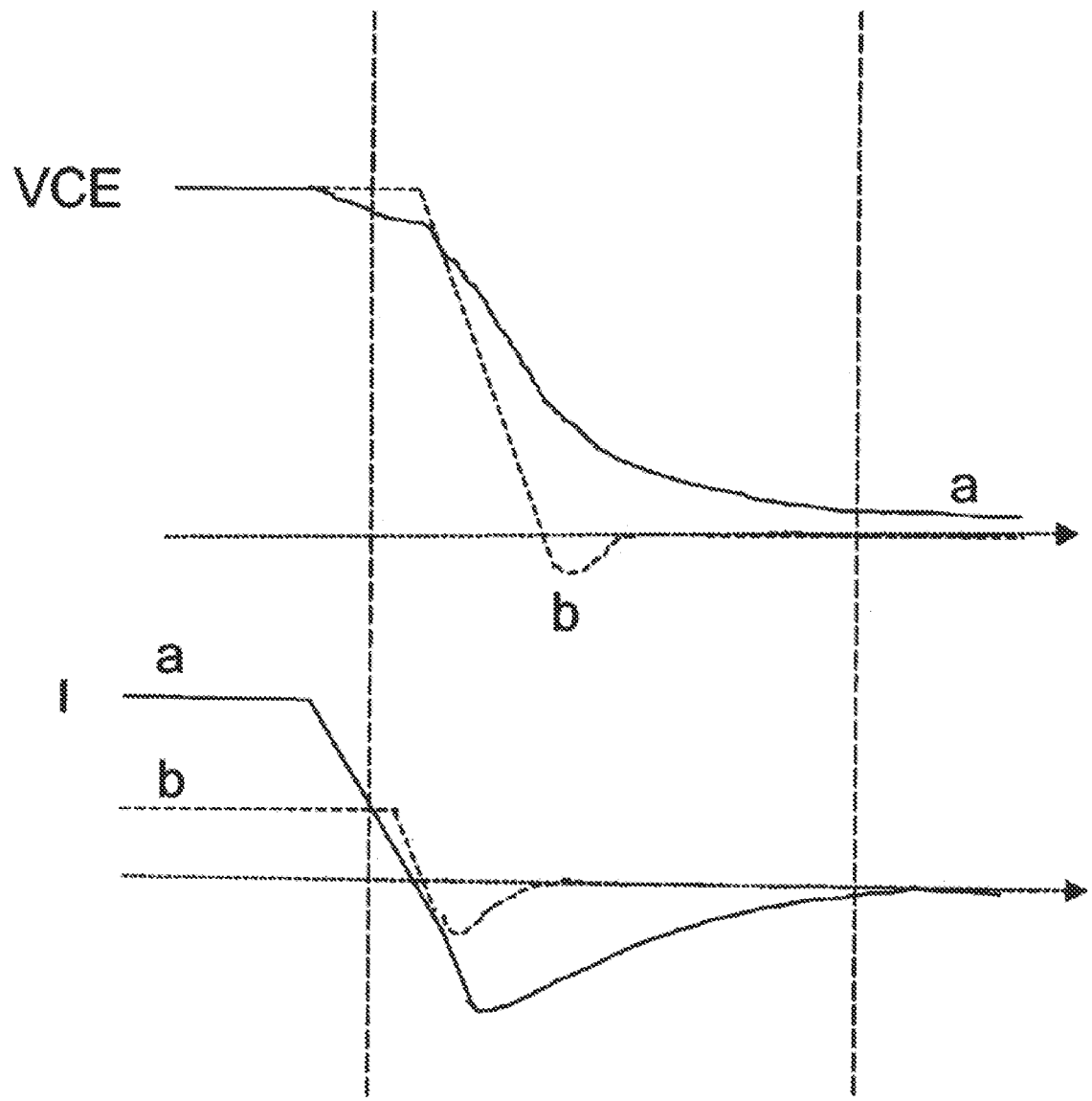
FIG. 10 is a waveform diagram for illustrating a problem of the power conversion device of the related art.

FIG. 8 depicts a configuration of a power conversion device according to a third embodiment. FIG. 8 is different from FIG. 1, in that a series circuit of a constant current source and a P-type MOSFET is each inserted between the inverting input terminal of the comparator 32 and the reference voltage source Vref1 and between the non-inverting input terminal of the comparator 32 and the output end of the sense voltage generation circuit 30. In the below; the configuration of the present embodiment is described in detail.

In FIG. 8, a source of a P-type MOSFET 377 is connected to an output end of a constant current source 39 and a non-inverting input terminal of the comparator 32. A drain of the P-type MOSFET 377 is connected to the reference potential. A gate of the P-type MOSFET 377 is connected to one end of the resistor element R1 and the sense terminal 21b. The other end of the resistor element R1 is connected to the reference potential.

A source of a P-type MOSFET 378 is connected to an output end of a constant current source 40 and an inverting input terminal of the comparator 32. A drain of the P-type MOSFET 378 is connected to the reference potential. A gate of the P-type MOSFET 378 is connected to the reference voltage source Vref1. The constant current source 39 and the constant current source 40 have the same temperature characteristic.

Since the other configurations are similar to FIG. 1, the same elements are denoted with the same reference signs, and the descriptions thereof are omitted.

In the IPM 1 configured as described above, a voltage value increased by a voltage (bias voltage) that is determined for the sense voltage mainly by an output current value of the constant current source 39 and an on-resistance value of the P-type MOSFET 377 is input to the non-inverting input terminal of the comparator 32. On the other hand, a voltage value increased by a voltage (bias voltage) that is determined for the voltage value of the reference voltage source Vref1 mainly by an output current value of the constant current source 40) and an on-resistance value of the P-type MOSFET 378 is input to the inverting input terminal of the comparator 32. Therefore, a series circuit of the constant current source 39 and the P-type MOSFET 377 and a series circuit of the constant current source 40 and the P-type MOSFET 378 each function as a bias circuit (50, 51) configured to increase a voltage.

Note that, the output current values of the constant current sources 39 and 40 are adjusted in advance so that voltages, which are input to the non-inverting input terminal and the inverting input terminal of the comparator 32 when the IPM 1 is at a certain temperature, are predetermined voltage values, respectively.

When a temperature rises in an operating state of the IPM 1 adjusted as described above, the output current values of the constant current sources 39 and 40 vary due to the effect of the temperature. However, even in this case, since the bias voltages also vary in the same manner by using the constant current sources having the same temperature characteristic, a difference between the voltage values that are each input to the non-inverting input terminal and the inverting input terminal of the comparator 32 becomes a value where a voltage variation due to the temperature characteristic of the constant current sources 39 and 40 is cancelled.

Therefore, for example, in the circuits shown in FIGS. 6 and 7, while the detection accuracy of the comparator 32 may be lowered due to the temperature characteristic of the constant current source 38, the circuit of the present embodiment can suppress the lowering in detection accuracy. That is, according to the present embodiment, it is possible to achieve the effect of accurately detecting the magnitude of the current of the IGBT even when the temperature in the device varies, in addition to the effects of the first and second embodiments.

The present invention is not limited to the above embodiments, and can be diversely modified and implemented without departing from the gist thereof. For example, in each embodiment, the operating region is divided into the two regions of the large current region and the small current region, and when an operation in the small current region is detected, the drive capacity to the IGBT is reduced. However, the current region may be further divided, and the drive capacity may be adjusted in a multi-stage manner according to a magnitude of the output current.

The invention claimed is:

1. A power conversion device comprising:
a semiconductor switching element having a control electrode terminal and two main electrode terminals and configured to control a current flowing between the two main electrode terminals by a drive signal applied to the control electrode terminal, the semiconductor switching element further comprising a diode inverse-parallel connected to the two main electrode terminals; and
a drive circuit configured to generate the drive signal in response to an input signal and to turn on/off the semiconductor switching element by the drive signal,
wherein the drive circuit is configured to detect the current flowing between the two main electrode terminals of the semiconductor switching element at a timing at which the semiconductor switching element is turned off, and to adjust a drive capacity of the semiconductor switching element in response to the current flowing between the two main electrode terminals when the semiconductor switching element is turned off, wherein the drive capacity of the semiconductor switching element is reduced when a value of a magnitude of the current flowing between the two main electrode terminals of the semiconductor switching element detected by the drive circuit is equal to or smaller than a predetermined value, and
wherein the drive circuit comprises:
a current detection unit configured to output a selection signal based on a magnitude of the sense current, and
a switch unit configured to output a voltage signal for determining the drive capacity based on the selection signal,
wherein the current detection unit comprises:
a sense voltage generation circuit configured to convert the sense current output from the sense terminal into a voltage and to output the voltage as a sense voltage,
a comparator configured to compare the sense voltage and a reference voltage and to output a result of the comparison,
a latch circuit configured to hold a signal indicative of the result of the comparison in synchronization with the input signal, and
a selection circuit configured to output the selection signal based on an output of the latch circuit, wherein the selection circuit comprises an inverter to invert the output of the latch circuit.

2. The power conversion device according to claim 1, wherein the semiconductor switching element has a sense terminal configured to output a sense current corresponding to the current flowing between the two main electrode terminals, and
wherein the drive circuit is configured to detect the current flowing between the two main electrode terminals by the sense current output from the sense terminal.

3. The power conversion device according to claim 2, wherein the drive circuit comprises: a drive unit configured to generate the drive signal by using the voltage signal and the input signal.

4. The power conversion device according to claim 1, wherein the sense voltage generation circuit is constituted by a resistor element inserted between the sense terminal and a reference potential, and is configured to output a voltage that is generated as the sense current output from the sense terminal flows through the resistor element.

5. The power conversion device according to claim 4, wherein the sense voltage generation circuit further comprises a constant current source, and
wherein a current output from the constant current source is caused to flow through the resistor element to increase the sense voltage by a predetermined voltage.

6. The power conversion device according to claim 5, wherein a second resistor element is inserted between the constant current source and the resistor element, and
wherein the sense voltage is extracted from a connection point of the constant current source and the second resistor element.

7. A power conversion device comprising:
a semiconductor switching element having a control electrode terminal and two main electrode terminals and configured to control a current flowing between the two main electrode terminals by a drive signal applied to the control electrode terminal; and
a drive circuit configured to generate the drive signal in response to an input signal and to turn on/off the semiconductor switching element by the drive signal, wherein
the drive circuit is configured to detect the current flowing between the two main electrode terminals of the semiconductor switching element at a timing at which the semiconductor switching element is turned off, and to adjust a drive capacity,
when the current flowing between the two main electrode terminals of the semiconductor switching element, which is detected at the timing at which the semiconductor switching element is turned off, becomes equal to or smaller than a predetermined value, the drive circuit reduces the drive capacity,
the semiconductor switching element has a sense terminal configured to output a sense current corresponding to the current flowing between the two main electrode terminals,
the drive circuit is configured to detect the current flowing between the two main electrode terminals by the sense current output from the sense terminal,
the drive circuit comprises:
a current detection unit configured to output a selection signal based on a magnitude of the sense current,
a switch unit configured to output a voltage signal for determining the drive capacity based on the selection signal, and
a drive unit configured to generate the drive signal by using the voltage signal and the input signal,
the current detection unit comprises:
a sense voltage generation circuit configured to convert the sense current output from the sense terminal into a voltage and to output the voltage as a sense voltage,
a comparator configured to compare the sense voltage and a reference voltage and to output a result of the comparison,
a latch circuit configured to hold a signal indicative of the result of the comparison in synchronization with the input signal, and
a selection circuit configured to output the selection signal based on an output of the latch circuit,
the sense voltage generation circuit is constituted by a resistor element inserted between the sense terminal and a reference potential, and is configured to output a voltage that is generated as the sense current output from the sense terminal flows through the resistor element,
the sense voltage generation circuit further comprises a constant current source,
a current output from the constant current source is caused to flow through the resistor element to increase the sense voltage by a predetermined voltage,
a second resistor element is inserted between the constant current source and the resistor element, and
the sense voltage is extracted from a connection point of the constant current source and the second resistor element,
wherein the switch unit comprises:
a plurality of voltage dividing resistor elements inserted in series between a voltage source and the reference potential, and
a switch element configured to select any one of at least two different voltages generated in the plurality of voltage dividing resistor elements by the selection signal and to output the selected voltage as the voltage signal.

8. The power conversion device according to claim 7, wherein the drive unit comprises a current mirror circuit configured to turn on the semiconductor switching element by supplying a drive signal of a current corresponding to the voltage signal to the control electrode terminal of the semiconductor switching element in synchronization with the input signal, and a switch circuit configured to turn off the semiconductor switching element by extracting charges accumulated in the control electrode terminal of the semiconductor switching element.

9. A power conversion device comprising:
a semiconductor switching element having a control electrode terminal and two main electrode terminals and configured to control a current flowing between the two main electrode terminals by a drive signal applied to the control electrode terminal;
a drive circuit configured to generate the drive signal in response to an input signal and to turn on/off the semiconductor switching element by the drive signal, wherein
the drive circuit is configured to detect the current flowing between the two main electrode terminals of the semiconductor switching element at a timing at which the semiconductor switching element is turned off, and to adjust a drive capacity,
when the current flowing between the two main electrode terminals of the semiconductor switching element, which is detected at the timing at which the semiconductor switching element is turned off, becomes equal to or smaller than a predetermined value, the drive circuit reduces the drive capacity, the semiconductor switching element has a sense terminal configured to output a sense current corresponding to the current flowing between the two main electrode terminals, the drive circuit is configured to detect the current flowing between the two main electrode terminals by the sense current output from the sense terminal, the drive circuit comprises:
- a current detection unit configured to output a selection signal based on a magnitude of the sense current,
- a switch unit configured to output a voltage signal for determining the drive capacity based on the selection signal, and
- a drive unit configured to generate the drive signal by using the voltage signal and the input signal, the current detection unit comprises:
- a sense voltage generation circuit configured to convert the sense current output from the sense terminal into a voltage and to output the voltage as a sense voltage,
- a comparator configured to compare the sense voltage and a reference voltage and to output a result of the comparison,
- a latch circuit configured to hold a signal indicative of the result of the comparison in synchronization with the input signal, and
- a selection circuit configured to output the selection signal based on an output of the latch circuit, a first bias circuit inserted between the comparator and the sense voltage generation circuit and configured to generate a bias voltage by connecting a constant current source and a MOSFET in series; and a second bias circuit inserted between the comparator and a voltage source configured to generate the reference voltage, and configured to generate a bias voltage by connecting a constant current source having a temperature characteristic similar to the constant current source and a MOSFET in series, wherein the first bias circuit is configured to add the bias voltage to the sense voltage and to supply the same to a non-inverting input terminal of the comparator, and wherein the second bias circuit is configured to add the bias voltage to the reference voltage and to supply the same to an inverting input terminal of the comparator.

* * * * *